(12) United States Patent
Sandhu et al.

(10) Patent No.: US 6,372,669 B2
(45) Date of Patent: *Apr. 16, 2002

(54) METHOD OF DEPOSITING SILICON OXIDES

(75) Inventors: Gurtej S. Sandhu; Ravi Iyer, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/410,234

(22) Filed: Sep. 30, 1999

Related U.S. Application Data

(63) Continuation of application No. 08/915,987, filed on Aug. 21, 1997, now Pat. No. 5,985,770.

(51) Int. Cl.$^7$ ................................................. H01L 21/31
(52) U.S. Cl. ...................... 438/787; 438/632; 438/659; 438/766; 438/782; 438/781
(58) Field of Search ................................ 438/787, 624, 438/631–632, 766, 659, 780–782

(56) References Cited

U.S. PATENT DOCUMENTS

| | | | | |
|---|---|---|---|---|
| 4,675,716 A | * | 6/1987 | Jones ........................... 357/71 |
| 5,192,697 A | | 3/1993 | Leong .......................... 438/624 |
| 5,457,073 A | | 10/1995 | Ouellet ........................ 438/624 |
| 5,527,561 A | | 6/1996 | Dobson ................... 427/383.3 |
| 5,531,183 A | * | 7/1996 | Sivaramakrishnam et al. ... 438/784 |
| 5,569,624 A | | 10/1996 | Weiner ........................ 438/563 |
| 5,670,397 A | | 9/1997 | Chang et al. ............... 438/232 |
| 5,700,720 A | | 12/1997 | Hashimoto .................. 438/632 |
| 5,703,404 A | * | 12/1997 | Matsuura ..................... 257/758 |
| 5,811,849 A | * | 9/1998 | Matsuura ..................... 257/306 |

OTHER PUBLICATIONS

Ghandhi, VLSI Fabrication Principles silicon and gallium arsenide, 337–339, 1983.*
Wolf, Silicon processing for the VLSI era, pp. 308–311, 1986.*
McClatchie, S., et al., "Low Dielectric Constant FLOW-FILL® Technology For IMD Applications".
Electrotech Ltd., Bristol, U.K., pp. 1–7, no date.
Kiermasz, A., et al., "Planarisation For Sub–Micron Devices Utilising A New Chemistry".
Electrotech Ltd., UK., pp. 1–3, DUMIC Conference, California (Feb./1995).
Beekmann, K., et al., "Sub–Micron Gap Fill and In–Situ Planarisation Using FLOWFILL® Technology".
Electrotech Ltd., U.K., pp. 1–7, VLSI Conference, Portland, Oregon (Oct./1995).
Ghandhi, VLSI Fabrication Principles silicon and gallium arsenide, 337–339, 1983.

* cited by examiner

*Primary Examiner*—Chandra Chaudhari
*Assistant Examiner*—Thanh Nguyen
(74) *Attorney, Agent, or Firm*—Well St. John P.S.

(57) ABSTRACT

The invention comprises methods of depositing silicon oxide material onto a substrate. In but one aspect of the invention, a method of depositing a silicon oxide containing layer on a substrate includes initially forming a layer comprising liquid silicon oxide precursor onto a substrate. After forming the layer, the layer is doped and transformed into a solid doped silicon oxide containing layer on the substrate. In a preferred implementation, the doping is by gas phase doping and the liquid precursor comprises $Si(OH)_4$. In the preferred implementation, the transformation occurs by raising the temperature of the deposited liquid precursor to a first elevated temperature and polymerizing the deposited liquid precursor on the substrate. The temperature is continued to be raised to a second elevated temperature higher than the first elevated temperature and a solid doped silicon oxide containing layer is formed on the substrate.

43 Claims, No Drawings

METHOD OF DEPOSITING SILICON OXIDES

RELATED PATENT DATA

This patent is a continuation application of U.S. patent application Ser. No. 08/915,987 which was filed on Aug. 21, 1997 now U.S. Pat. No. 5,985,770

TECHNICAL FIELD

This invention relates to methods of depositing silicon oxides, such as silicon dioxide, over substrates.

BACKGROUND OF THE INVENTION

In methods of forming integrated circuits, it is frequently desired to isolate components of the integrated circuits from one another with insulative material. Such insulative material may comprise a number of materials, including for, example, silicon dioxide, silicon nitride, and undoped semiconductive material. Although such materials have acceptable insulative properties in many applications, the materials disadvantageously have high dielectric constants which can lead to capacitive coupling between proximate conductive elements. For instance, silicon dioxide has a dielectric constant of about 4, silicon nitride has a dielectric constant of about 8, and undoped silicon has a dielectric constant of about 12. As circuit density increases with device geometries becoming smaller, the associated RC delay time increases, and hence there is a need to reduce capacitance below that of silicon dioxide material. Further as geometries have become smaller, it is much more difficult to conformally deposit layers into contact and other openings having high aspect ratio.

One known way of achieving desired lower dielectric constant silicon oxides, such as silicon dioxide, is to provide suitable dopant atoms within the material. Fluorine is but one example, to provide a fluorinated silicon oxide of the general formula $F_xSiO_y$.

One recently developed technique for achieving suitable deposition into substrates having high aspect ratio topography, has been developed by Electrotech Limited of Bristol, U.K., and is referred to as a Flowfill™ technology. In such process, $SiH_4$ and $H_2O_2$ are separately introduced into a CVD chamber, such as a parallel plate reaction chamber. The reaction rate between $SiH_4$ and $H_2O_2$ can be moderated by the introduction of nitrogen into the reaction chamber. The wafer is ideally maintained at a suitably low temperature, such as 0° C. at an exemplary pressure of 1 Torr to achieve formation of a silanol-type structure of the formula $Si(OH)_4$ which condenses onto the wafer surface. Although the reaction occurs in the gas phase, the deposited $Si(OH)_4$ is in the form of a very viscous liquid which flows to fill very small gaps on the wafer surface. And as deposition thickness increases, surface tension drives the deposited layer flat, thus forming a planarized layer over the substrate.

The liquid $Si(OH)_4$ is typically then converted to a silicon dioxide structure by a two-step process. First, polymerization of the liquid film is promoted by increasing the temperature to about 100° C. to result in solidification and formation of a polymer layer. Thereafter, the temperature is raised to approximately 450° C. to depolymerize the substance and form $SiO_2$. The depolymerization temperature also provides the advantage of driving undesired water from the resultant $SiO_2$ layer.

Doping of such $SiO_2$ layer has in the past been attempted by providing a dopant gas in combination with the gaseous $H_2O_2$ and gaseous $SiH_4$ precursors during the initial formation of the $Si(OH)_4$ liquid. Such deposition techniques have not met with much success and few if any suitable chemistries have been discovered for such to date. Most attempts for dopant incorporation in this manner invariably result in the loss of the desired flow-filling properties of the films.

Accordingly, it would be desirable to develop alternate methods of achieving doped silicon oxides, such as silicon dioxides, formed via a process using silicon oxide precursors, such as for example $Si(OH)_4$.

SUMMARY OF INVENTION

The invention comprises methods of depositing silicon oxide material onto a substrate. In but one aspect of the invention, a method of depositing a silicon oxide containing layer on a substrate includes initially forming a layer comprising liquid silicon oxide precursor onto a substrate. After forming the layer, the layer is doped and transformed into a solid doped silicon oxide containing layer on the substrate. In a preferred implementation, the doping is by gas phase doping and the liquid precursor comprises $Si(OH)_4$. In the preferred implementation, the transformation occurs by raising the temperature of the deposited liquid precursor to a first elevated temperature and polymerizing the deposited liquid precursor on the substrate. The temperature is continued to be raised to a second elevated temperature higher than the first elevated temperature and a solid doped silicon oxide containing layer is formed on the substrate.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a silane gas, such as $SiH_4$ or $Si_2H_6$, is combined with gaseous $H_2O_2$ within a chemical vapor deposition reactor at a temperature of from about −10° C. to about 30° C. to deposit a liquid polymer precursor onto a substrate within the reactor. A specific example wafer temperature is 0° C. with an exemplary pressure being 1 Torr. An example flow rate for a six liter reactor for $SiH_4$ and $H_2O_2$ are 100 sccm and 0.75 gm/min, respectively. After about 120 minutes, a 6000 Angstroms thick liquid layer deposits. Such will form $Si(OH)_4$, in this example in liquid form, onto a substrate. In this example, the deposited layer will consist essentially of $Si(OH)_4$. Such provides but one example of forming a liquid silicon oxide precursor onto a substrate.

The deposited precursor is then doped, preferably by gas phase doping, on the substrate and substantially after its formation, The selected gas for preferred gas phase doping will be dependent on the ultimate desired dopant within the ultimate silicon oxide layer. For example, $PH_3$ or phosphates such as trialkyl phosphates (i.e., trimethyl phosphate, triethyl phosphate) and phosphites such as dialkyl phosphites (i.e., dimethyl phosphite) are example and preferred gases where the dopant is to be phosphorous. $B_2H_6$ is an example and preferred gas where the dopant is to be boron. $NF_3$ and $F_2$ are example and preferred gases (alone or in combination) where/the dopant material is to be fluorine. $C_2H_6$, trirethylsilane [$(CH_3)_3SiH$] and $CH_4$ are example and preferred gases (alone or in combination) where the desired dopant is to be carbon. $NF_3$ and $NH_3$ are example and preferred gases (alone or in combination) where the dopant material is to be nitrogen. Various combinations of these gases could also be used to incorporate multiple different dopants. An example doping gas flow rate for a six liter reactor is 500 sccm.

Doping could also be provided using gas phase doping with plasma. For example, a plasma can be struck with the dopant gases proximate the formed liquid oxide precursor. The dopants are then available in activated states and may incorporate into the film more easily. Further, the dopants can be formed as plasma external of the processing chamber holding the wafer for doping, with the plasma dopants then being transported to the chamber holding the wafer for such doping.

Preferred reactor temperature and pressure for the gas phase doping is preferably at a temperature of less than or equal to about 50° C. and a pressure below 100 Torr. Temperature and pressure are ideally selected to achieve dopant diffusion through the total depth of the liquid layer.

The temperature of the liquid is also preferably maintained at or below 50° C. during the gas phase doping to avoid any substantially polymerizing of the liquid in advance of the doping. The temperature of the deposited liquid precursor is then raised to a first elevated temperature and polymerizing thereof occurs on the substrate. An exemplary and preferred first elevated temperature is at least about 100° C. The temperature is preferably held at this first elevated temperature for a period of time, for example 1 minute. Then, the temperature of the polymerized precursor is raised to a second elevated temperature which is higher than the first elevated temperature, and a solid doped silicon oxide containing layer is effectively formed on the substrate. An exemplary second elevated temperature is at least about 350° C., with 450° C. being preferred. Pressure is preferably maintained constant during both temperature ramps at, for example, from 0.1 Torr to 100 Torr.

Such provides but one example of transforming a substantially non-silicon oxide containing precursor layer into a solid doped silicon oxide containing layer on a substrate. The second elevated temperature effectively also provides an advantage of driving undesired water and other impurities from the layer. In the above-described exemplary transforming, such comprises initial polymerizing followed by depolymerizing of a silicon oxide precursor. Also preferably, the gas phase or other doping is completed prior to any substantial transforming of the doped layer to a polymer layer or silicon dioxide layer. However, gas phase or other doping with desired impurities could also occur during the temperature raising or other transformation. Thus in the preferred embodiment, the doping occurs both prior to the transforming, and is completed prior to the transforming. Also, the gas phase doping is completed prior to the temperature raising to the first temperature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of depositing a silicon oxide containing layer on a substrate comprising:

forming an undoped layer comprising liquid silicon oxide precursor from gaseous precursors, the layer being formed on a substrate; and after forming the layer, doping and transforming the layer into a solid doped silicon oxide containing layer on the substrate.

2. The method of depositing silicon oxide of claim 1 wherein the doping occurs prior to the transforming.

3. The method of depositing silicon oxide of claim 1 wherein the doping is completed prior to the transforming.

4. The method of depositing silicon oxide of claim 1 wherein the doping comprises gas phase doping.

5. The method of depositing silicon oxide of claim 1 wherein the doping comprises gas phase doping using dopants provided as plasma proximate the layer.

6. The method of depositing silicon oxide of claim 1 wherein the forming occurs in one processing chamber, the doping comprises gas phase doping using dopants provided as plasma proximate the layer, the dopants being formed as plasma external of the one processing chamber and being transported to the processing chamber.

7. The method of depositing silicon oxide of claim 1 wherein the doping is conducted at a temperature of less than or equal to about 50° C.

8. The method of depositing silicon oxide of claim 1 wherein the liquid silicon oxide precursor comprises $Si(OH)_4$.

9. The method of depositing silicon oxide of claim 1 wherein the liquid silicon oxide precursor consists essentially of $Si(OH)_4$.

10. The method of depositing silicon oxide of claim 1 wherein the transforming comprises polymerizing and depolymerizing.

11. The method of depositing silicon oxide of claim 1 wherein the doping comprises a carbon containing dopant.

12. The method of depositing silicon oxide of claim 1 wherein the doping comprises a dopant selected from the group consisting of phosphorus, fluorine, nitrogen carbon and boron, or mixtures thereof.

13. A method of depositing a silicon oxide containing material on a substrate comprising:

forming a liquid silicon oxide precursor essentially free of dopant on a substrate;

gas phase doping the liquid silicon oxide precursor on the substrate using dopants provided as plasma proximate the liquid silicon oxide precursor; and transforming the liquid doped silicon oxide precursor into a solid doped silicon oxide containing layer on the substrate.

14. A method of depositing a silicon oxide containing material on a substrate comprising:

forming a liquid silicon oxide precursor essentially free of dopant on a substrate in one processing chamber;

gas phase doping the liquid silicon oxide precursor on the substrate using dopants provided as plasma proximate the liquid silicon oxide precursor, the dopants being formed as plasma external of the one processing chamber and being transported to the processing chamber; and transforming the liquid doped silicon oxide precursor into a solid doped silicon oxide containing layer on the substrate.

15. A method of depositing a silicon oxide containing material on a substrate comprising:

forming a liquid silicon oxide precursor essentially free of dopant on a substrate in one processing chamber;

gas phase doping the liquid silicon oxide precursor on the substrate using dopants provided as plasma proximate the liquid silicon oxide precursor, the dopants being formed as plasma external of the one processing chamber and being transported to the processing chamber; and transforming the liquid doped silicon oxide precursor into a solid doped silicon oxide containing layer on the substrate.

16. The method of depositing silicon oxide of claim 15 wherein the doping is completed prior to any substantial transforming.

17. The method of depositing silicon oxide of claim 15 wherein the doping comprises gas phase doping.

18. The method of depositing silicon oxide of claim 15 wherein the $Si(OH)_4$ is in liquid form during the doping.

19. The method of depositing silicon oxide of claim 15 wherein the doping is conducted at a temperature of less than or equal to about 50° C.

20. The method of depositing silicon oxide of claim 15 wherein the transforming comprises polymerizing and depolymerizing.

21. The method of depositing silicon oxide of claim 15 wherein the doping comprises gas phase doping using dopants provided as plasma proximate the layer.

22. The method of depositing silicon oxide of claim 15 wherein the forming occurs in one processing chamber, the doping comprises gas phase doping using dopants provided as plasma proximate the layer, the dopants being formed as plasma external of the one processing chamber and being transported to the processing chamber.

23. A method of depositing a silicon oxide containing layer on a substrate comprising:

combining a silicon source gas with an oxygen source gas to deposit a liquid silicon oxide precursor essentially free of dopant onto a substrate;

after the depositing, and in a separate discrete step from the depositing, gas phase doping the deposited liquid silicon oxide precursor on the substrate, the gas phase doping utilizing dopants provided as plasma proximate the deposited liquid silicon oxide precursor;

after the gas phase doping, polymerizing the deposited liquid precursor on the substrate; and raising the temperature of the polymerized precursor to convert it to a solid doped silicon oxide containing layer on the substrate.

24. A method of depositing a silicon oxide containing layer on a substrate comprising:

combining a silicon source gas with an oxygen source gas at a temperature of from about −10° C. to about 300° C. to deposit a liquid silicon oxide precursor essentially free of dopant onto a substrate;

after the depositing, and in a separate discrete step from the depositing, gas phase doping the deposited liquid silicon oxide precursor on the substrate, the gas phase doping utilizing dopants provided as plasma proximate the deposited liquid silicon oxide precursor;

after the gas phase doping, raising the temperature of the deposited liquid precursor to a first elevated temperature and polymerizing the deposited liquid precursor on the substrate; and raising the temperature of the polymerized precursor to a second elevated temperature higher than the first elevated temperature and forming a solid doped silicon oxide containing layer on the substrate.

25. The method of depositing silicon oxide of claim 24 wherein the deposit of liquid polymer precursor and the gas phase doping is conducted at substantially the same temperature.

26. The method of depositing silicon oxide of claim 24 wherein the deposit of liquid polymer precursor and the gas phase doping is conducted at substantially the same pressure.

27. The method of depositing silicon oxide of claim 24 wherein the first elevated temperature is at least about 100° C.

28. The method of depositing silicon oxide of claim 24 wherein the second elevated temperature is at least about 350° C.

29. The method of depositing silicon oxide of claim 24 wherein the first elevated temperature is at least about 100° C. and the second elevated temperature is at least about 350° C.

30. The method of depositing silicon oxide of claim 24 wherein the doping is conducted at a temperature of less than or equal to about 50° C.

31. The method of depositing silicon oxide of claim 24 wherein the gas phase doping comprises a doping gas selected from the group consisting of $PH_3$, $B_2H_6$, $F_2$, $NH_3$, $NF_3$, $C_2F_6$ and $CH_4$, or mixtures thereof.

32. The method of depositing silicon oxide of claim 24 wherein the forming occurs in one processing chamber and the dopants are formed as plasma external of the one processing chamber and then transported to the processing chamber.

33. A method of depositing a silicon oxide containing layer on a substrate comprising:

forming an undoped layer on a substrate, said layer comprising liquid silicon oxide precursor from gaseous precursors and an absence of added dopant, wherein the absence of added dopant instills better flow-fill properties in the layer than a presence of dopant; and after forming the layer, doping and transforming the layer into a solid doped silicon oxide containing layer on the substrate.

34. The method of depositing silicon oxide of claim 33 wherein the doping occurs prior to the transforming.

35. The method of depositing silicon oxide of claim 33 wherein the doping is completed prior to the transforming.

36. The method of depositing silicon oxide of claim 33 wherein the doping comprises gas phase doping.

37. The method of depositing silicon oxide of claim 33 wherein the forming occurs in one processing chamber, the doping comprises gas phase doping using dopants provided as plasma proximate the layer, the dopants being formed as plasma external of the one processing chamber and being transported to the processing chamber.

38. The method of depositing silicon oxide of claim 33 wherein the doping is conducted at a temperature of less than or equal to about 50° C.

39. The method of depositing silicon oxide of claim 33 wherein the liquid silicon oxide precursor comprises $Si(OH)_4$.

40. The method of depositing silicon oxide of claim 33 wherein the liquid silicon oxide precursor consists essentially of $Si(OH)_4$.

41. The method of depositing silicon oxide of claim 33 wherein the transforming comprises polymerizing and depolymerizing.

42. The method of depositing silicon oxide of claim 33 wherein the doping comprises utilization of a carbon containing dopant.

43. The method of depositing silicon oxide of claim 33 wherein the doping comprises utilization of a dopant selected from the group consisting of phosphorus, fluorine, nitrogen carbon and boron, or mixtures thereof.

* * * * *

UNITED STATES PATENT AND TRADEMARK OFFICE
CERTIFICATE OF CORRECTION

PATENT NO. : 6,372,669 B2
DATED : April 16, 2002
INVENTOR(S) : Gurtej S. Sandhu et al.

It is certified that error appears in the above-identified patent and that said Letters Patent is hereby corrected as shown below:

Column 2,
Line 62, replace "where/the" with -- where the --.
Line 63, replace "trirethylsilane" with -- trimethylsilane --.

Column 5,
Line 48, replace "300º" with -- 30º --.

Signed and Sealed this

Seventh Day of January, 2003

JAMES E. ROGAN
*Director of the United States Patent and Trademark Office*